(12) United States Patent
Nagashima

(10) Patent No.: US 12,399,215 B2
(45) Date of Patent: Aug. 26, 2025

(54) HOUSING AND PROBER

(71) Applicant: Tokyo Seimitsu Co., Ltd., Tokyo (JP)

(72) Inventor: Hideaki Nagashima, Tokyo (JP)

(73) Assignee: TOKYO SEIMITSU CO., LTD., Tokyo (JP)

( * ) Notice: Subject to any disclaimer, the term of this patent is extended or adjusted under 35 U.S.C. 154(b) by 0 days.

(21) Appl. No.: 18/731,040

(22) Filed: May 31, 2024

(65) Prior Publication Data

US 2024/0319264 A1 Sep. 26, 2024

Related U.S. Application Data

(63) Continuation of application No. PCT/JP2022/036737, filed on Sep. 30, 2022.

(30) Foreign Application Priority Data

Dec. 2, 2021 (JP) .................................. 2021-196404

(51) Int. Cl.
*G01R 31/28* (2006.01)

(52) U.S. Cl.
CPC .................. *G01R 31/2893* (2013.01)

(58) Field of Classification Search
CPC ............ G01R 31/2887; G01R 1/06722; G01R 1/07314; G01R 1/07342; G01R 31/26; G01R 31/2867; G01R 31/2893; G01R 31/318511; G01R 1/0491; G01R 31/2862; G01R 31/2863; G01R 31/2886; G01R 31/2891; G01R 31/31907;

(Continued)

(56) References Cited

U.S. PATENT DOCUMENTS

2018/0017594 A1 1/2018 Tamura
2021/0088588 A1 3/2021 Endo

FOREIGN PATENT DOCUMENTS

CN        108470690 A    8/2018
JP        2016-181639 A  10/2016
(Continued)

OTHER PUBLICATIONS

Espacenet English translation of JP 2019109242 A (Year: 2019).*
(Continued)

*Primary Examiner* — Eman A Alkafawi
*Assistant Examiner* — Courtney G McDonnough
(74) *Attorney, Agent, or Firm* — Birch, Stewart, Kolasch & Birch, LLP

(57) ABSTRACT

A housing for a prober having a multi-layer structure in which measuring parts are stacked includes: floor bases configured to floor surfaces of respective layers of the multi-layer structure; and at least one side frame body which is arranged between a floor base of one layer and a floor base of another layer positioned above the one layer among the plurality of layers, and which is positioned in both side parts of the measuring parts, wherein the side frame body includes: a first side frame which is erected on the floor base of the one layer and which supports a lower surface side of the floor base of the another layer; and a second side frame which is erected on the floor base of the one layer at a position different from that of the first side frame, and supports a measuring part constituent member arranged in the measuring part.

7 Claims, 11 Drawing Sheets

(58) Field of Classification Search
CPC ......... H01L 21/67242; H01L 21/67253; H01L 21/67259; H01L 22/14; H01L 22/20; H01L 22/30
USPC .................................................. 324/757.03
See application file for complete search history.

(56) References Cited

FOREIGN PATENT DOCUMENTS

| JP | 2016-181690 A | | 10/2016 | | |
|---|---|---|---|---|---|
| JP | 2017-28296 A | | 2/2017 | | |
| JP | 2019109242 A | * | 7/2019 | ............. | G01R 31/28 |
| JP | 2021-52065 A | | 4/2021 | | |
| KR | 10-2021-0019193 A | | 2/2021 | | |
| KR | 20210019193 A | * | 2/2021 | ......... | G01R 31/2893 |

OTHER PUBLICATIONS

Espacenet English translation of KR 20210019193 A (Year: 2021).*
Espacenet translation of Nagashima JP2019109242A Enclosure (Year: 2019).*
International Preliminary Report on Patentability for PCT/JP2022/036737 (PCT/IPEA/409) dated Jul. 13, 2023.
International Search Report for PCT/JP2022/036737 (PCT/ISA/210) mailed on Dec. 20, 2022.
Written Opinion for PCT/JP2022/036737 (PCT/ISA/237) dated Dec. 20, 2022.
Chinese Office Action and Search Report for corresponding Chinese Application No. 202280079960.4, dated Oct. 12, 2024, with an English translation.
Chinese Office Action for Chinese Application No. 202280079960.4, dated Jun. 6, 2025, with an English translation.

* cited by examiner

HOUSING AND PROBER

CROSS-REFERENCE TO RELATED APPLICATIONS

The present application is a Continuation of PCT International Application No. PCT/JP2022/036737 filed on Sep. 30, 2022 claiming priority under 35 U.S.C § 119(a) to Japanese Patent Application No. 2021-196404 filed on Dec. 2, 2021. Each of the above applications is hereby expressly incorporated by reference, in their entirety, into the present application.

BACKGROUND OF THE INVENTION

Field of the Invention

The present invention relates to a prober for an inspection of electrical characteristics of semiconductor devices (chips) formed on a semiconductor wafer and, particularly, to a housing for a prober including a plurality of measuring parts stacked in multiple stages and to a prober to which the housing is applied.

Description of the Related Art

A semiconductor manufacturing process includes a large number of steps and various inspections are performed in various manufacturing steps in order to guarantee product quality and improve production yield. For example, in a stage where chips of semiconductor devices have been formed on a semiconductor wafer, a wafer-level inspection is performed in which an electrode pad of a semiconductor device of each chip is connected to a test head, power and a test signal are supplied from the test head, and a signal outputted from the semiconductor device is measured by the test head to electrically inspect whether or not the semiconductor device operates properly.

The wafer-level inspection is performed using a prober which brings a probe into close contact with the electrode pad of each chip on the wafer. The probe is electrically connected to a terminal of the test head. Then, power and a test signal are supplied to each chip from the test head via the probe, and output signal from each chip are detected by the test head to measure whether or not each chip operates properly.

In semiconductor manufacturing processes, upsizing of wafers and further micronizing (integration) are being promoted in order to reduce manufacturing costs, and there has been a significant increase in the number of chips to be formed on one wafer. Accordingly, given that a period of time required to inspect one wafer with a prober is becoming longer, there is a need for improvements in throughput.

Hence, in order to improve throughput, a large number of probes are provided to perform multi-probing so that a plurality of chips may be simultaneously inspected. Recently, the number of chips to be simultaneously inspected has been more and more increased, and attempts have even been made to simultaneously inspect all of the chips on a wafer. To this end, an allowable error of alignment when bringing an electrode pad and a probe into contact with each other is becoming smaller and, consequently, higher positional accuracy in movement of probes is required.

While increasing the number of probers is conceivable as the simplest method of increasing throughput, increasing the number of probers also creates a problem in that an installation area of probers on a production line also increases. In addition, increasing the number of probers also results in proportionally increasing device cost. Therefore, there is a need to increase throughput while suppressing the increase in the installation area and the increase in device cost.

To address such problems, probers having a plurality of measuring parts stacked in multiple stages are being proposed (for example, refer to Patent Literature 1 and Patent Literature 2). Since these probers have a multi-layer structure (multi-stage structure) in which the measuring parts are stacked in multiple stages, a wafer-level inspection can be performed by each measuring part so that throughput may be improved while suppressing the increase in installation area and the increase in device cost.

On the other hand, Patent Literature 3 relates to an inspection device in which a plurality of testers are arranged in a multi-layer structure, and a conveyance stage which conveys a wafer to a tester is provided to each layer. Patent Literature 3 discloses a technique to suppress an effect of vibration created by the operation of the conveyance stages of other layers. In Patent Literature 3, when the conveyance stage of one layer among the multi-layer structure is in operation, a controller which controls movement of the conveyance stage of each layer perform control so as to restrict operations of the conveyance stages of other layers in order to suppress an effect of vibration created by the operation of the conveyance stages of other layers.

CITATION LIST

Patent Literature 1: Japanese Patent Application Laid-Open No. 2017-028296
Patent Literature 2: Japanese Patent Application Laid-Open No. 2016-181690
Patent Literature 3: Japanese Patent Application Laid-Open No. 2021-052065

SUMMARY OF THE INVENTION

Each of the probers disclosed in Patent Literature 1 and Patent Literature 2 includes an alignment device (moving stage) for each layer, which detachably holds a wafer chuck and performs relative positioning (alignment) between a wafer held by the wafer chuck and a probe card. The alignment device is configured to be movable among measuring parts arranged on each layer. When such a prober is constructed using a housing (an integrated housing) in which a plurality of frames that form a plurality of compartments are combined and integrated with each other, the following problem arises.

In the probers described above, since the alignment device capable of moving among measuring parts is provided on each layer, the probers are structured in such a manner that when the alignment device is moved on one layer, vibration caused by the movement of the alignment device readily propagates to a measuring part arranged on other layers via the frames that make up the housing. As a result, there is a risk that due to a decline in accuracy of alignment, sufficient contact accuracy between the wafer and probes of a probe card may no longer be secured so that inspection accuracy may deteriorate.

On the other hand, with the technology disclosed in Patent Literature 3, since the movement of the conveyance stage on other layers is restricted when the conveyance stage on one layer among the plurality of layers is in operation, there is a risk that a period of time required for the movement of the conveyance stage may increase so that throughput of the inspection may decline.

In addition, the technique disclosed in Patent Literature 3 also has a problem in that the technique is only effective to vibration due to a movement of a conveyance stage and is ineffective to vibration constantly generated due to other factors such as vibration caused by an abnormality of a test head of another layer.

The present invention has been made in consideration of the circumstances described above, and aims to provide, a housing for a prober having a multi-layer structure in which a plurality of measuring parts are stacked in multiple stages, the housing capable of effectively reducing adverse effect of vibration generated on each layer without deterioration in throughput of inspection, and a prober to which the housing is applied.

The following invention is provided in order to solve the problems described above.

A housing for a prober according to a first aspect is a housing for a prober having a multi-layer structure in which a plurality of measuring parts are stacked in multiple stages. The housing for a prober includes: floor bases configured to constitute floor surfaces of respective layers of the multi-layer structure; and at least one side frame body which is arranged between a floor base of one layer and a floor base of another layer positioned above the one layer among the plurality of layers, and positioned in both side parts of the measuring parts, wherein the side frame body includes: a first side frame which is erected on the floor base of the one layer and supports a lower surface side of the floor base of the another layer; and a second side frame which is erected on the floor base of the one layer at a position different from that of the first side frame, and supports a measuring part constituent member arranged in each measuring part.

According to a second aspect, in the housing for a prober according to the first aspect, the side frame body is arranged on a layer other than an uppermost layer among the plurality of layers. Making the configuration of the uppermost layer to be simpler than the layers other than the uppermost layer, enables the uppermost layer to be lighter so that a structure of the entire housing may be stabilized.

According to a third aspect, the housing for a prober according to the second aspect further includes a head plate having a holding unit configured to hold the measuring part constituent member, wherein a lower surface side of the head plate is supported by the second side frame.

According to a fourth aspect, in the housing for a prober according to any one of the first to third aspects, the second side frame is juxtaposed to the first side frame at a position adjacent to the first side frame.

According to a fifth aspect, in the housing for a prober according to any one of the first to fourth aspects, the measuring part constituent member is one of a pogo frame, a probe card and a test head.

A prober according to a sixth aspect includes the housing for a prober according to any one of the first to fifth aspects, wherein at least two or more measuring parts are provided on the one layer, and the prober includes a moving stage capable of moving a wafer to be inspected to each of the measuring parts arranged on the one layer.

According to the present invention, in a housing for a prober having a multi-layer structure in which a plurality of measuring parts are stacked in multiple stages, an effect of vibration generated on each layer may be effectively reduced, without deterioration in throughput of inspection.

DESCRIPTION OF THE EMBODIMENTS

Hereinafter, a preferred embodiment of the present invention will be described with reference to the accompanying drawings. Firstly, a prober 100 according to the present embodiment will be described, then a housing 1 to be applied to the prober 100 will be described.

[Prober]

Figure 1:
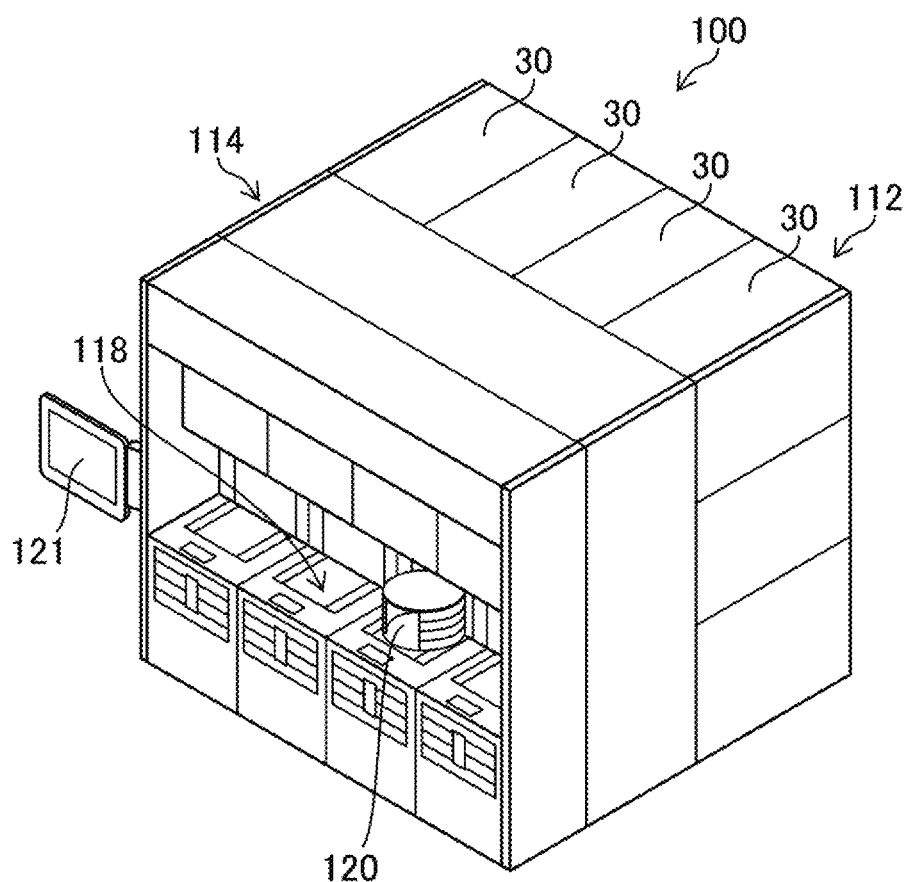
FIG. 1 is an external view showing an overall configuration of a prober according to a present embodiment.
Figure 2:
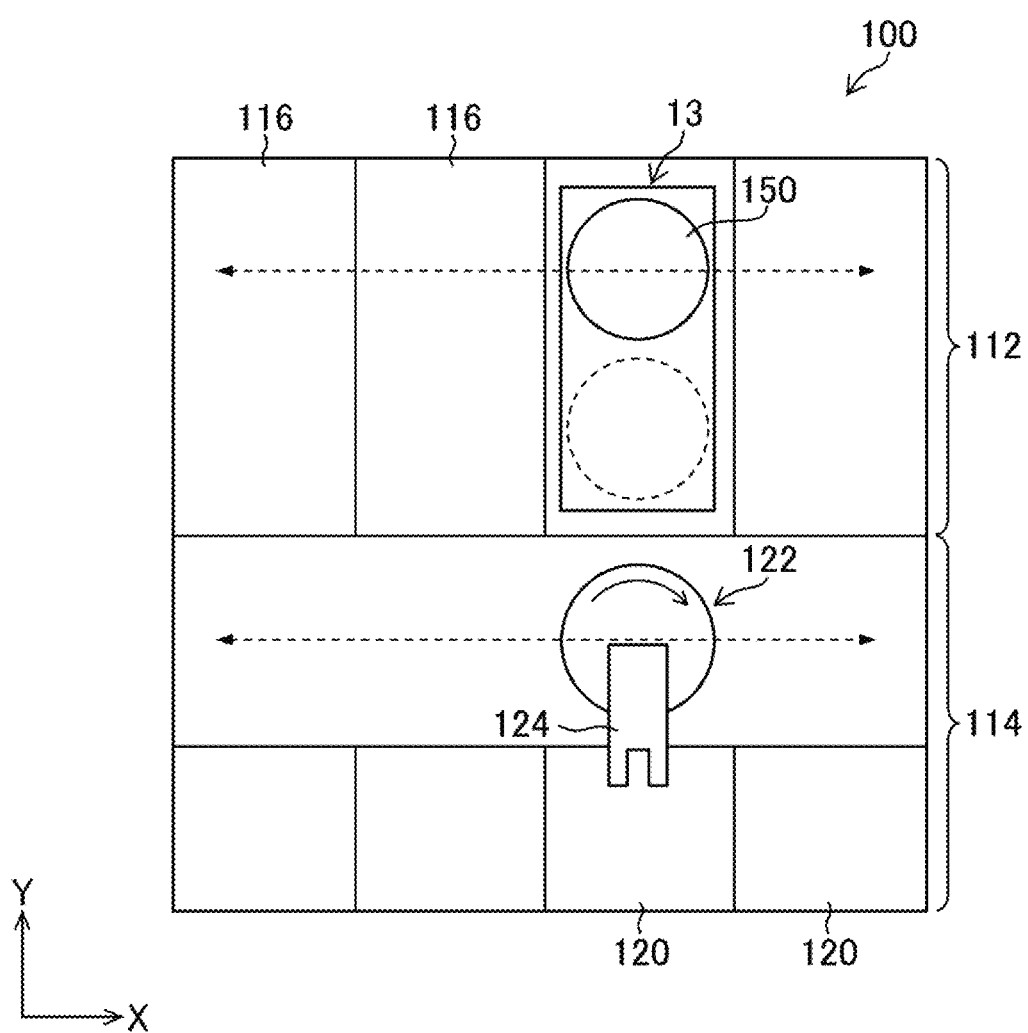
FIG. 2 is a plan view of the prober shown in FIG. 1.

First, a configuration of the prober 100 will be described with reference to FIGS. 1 and 2. FIG. 1 is an external view showing an overall configuration of the prober 100. FIG. 2 is a plan view of the prober 100 shown in FIG. 1.

As shown in FIGS. 1 and 2, the prober 100 according to the present embodiment includes a loader unit 114 which supplies and collects a wafer W (refer to FIG. 5) to be inspected, and a measurement unit 112 which is arranged adjacent to the loader unit 114. The measurement unit 112 includes measuring parts 30 and when the wafer W (inspection object) is supplied to each measuring part 30 from the loader unit 114, an inspection (wafer-level inspection) of electrical characteristics is respectively performed for each chip of the wafer W in each measuring part 30. Then, the wafer W inspected in each measuring part 30 is collected by the loader unit 114. Note that the prober 100 is also equipped with an operating panel 121, a control device (not illustrated) for controlling the respective units, and the like.

The loader unit 114 has a load port 118 on which a wafer cassette 120 is placed and a conveyance unit 122 which conveys the wafer W between each measuring part 30 of the measurement unit 112 and the wafer cassette 120. The conveyance unit 122 is equipped with a conveyance unit drive mechanism (not illustrated) and is configured to be movable in X and Z directions and rotatable in a θ direction (around the Z direction). In addition, the conveyance unit 122 is equipped with a conveyance arm 124 and is capable of stretching and contracting the conveyance arm 124 in the Y direction with the conveyance unit drive mechanism. A suction pad (not illustrated) is provided in an upper surface part of the conveyance arm 124, and the conveyance arm 124 holds the wafer W by subjecting a rear surface of the wafer W to vacuum suction with the suction pad. Accordingly, the wafer W inside the wafer cassette 120 is extracted by the conveyance arm 124 of the conveyance unit 122 and conveyed to each measuring part 30 of the measurement unit 112 in a state of being held by the upper surface of the conveyance arm 124. In addition, the inspected wafer W for which the inspection has been finished is returned to the wafer cassette 120 from each measuring part 30 via a reverse route.

Figure 3:
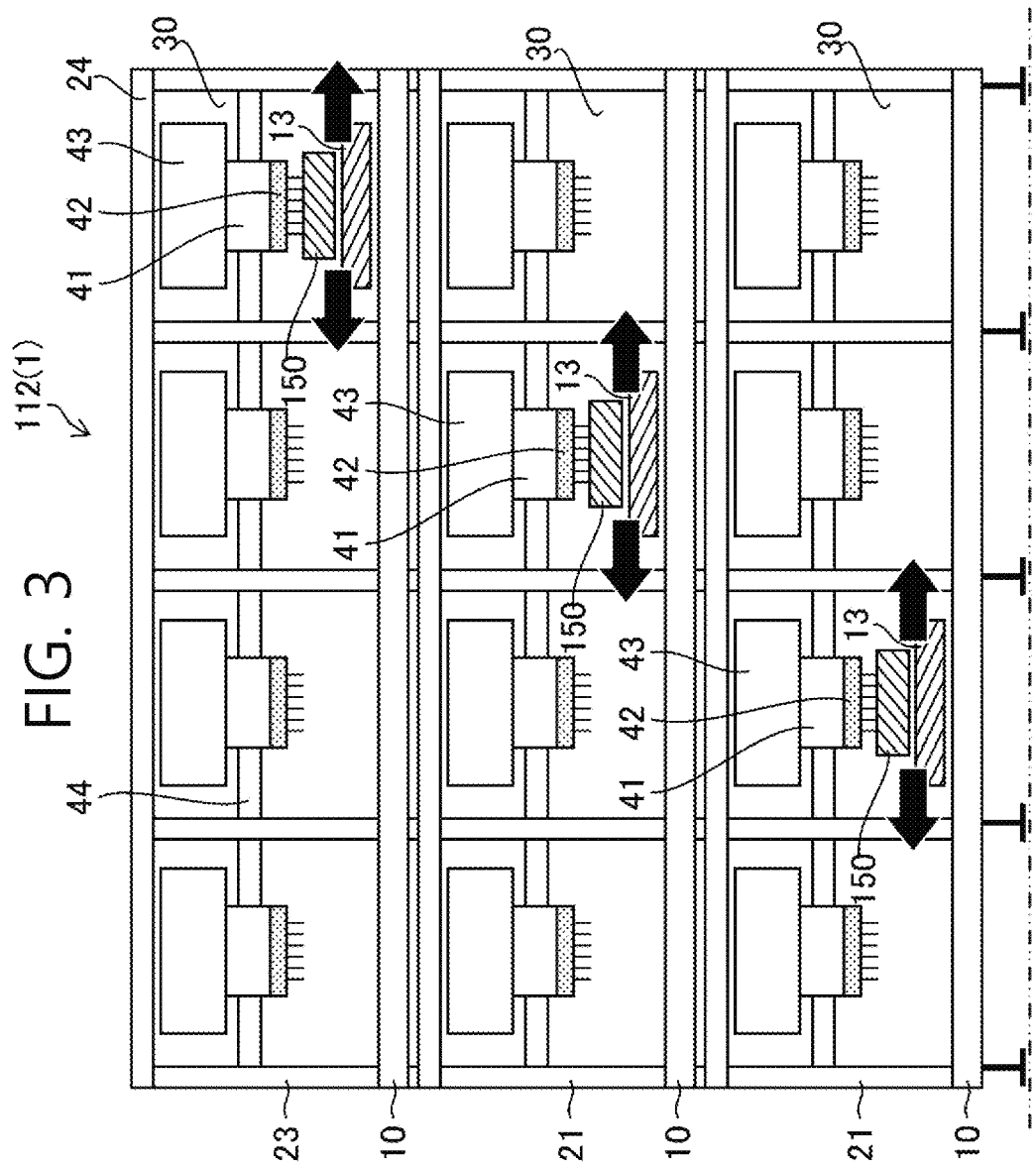
FIG. 3 is a diagram (front view) showing an internal structure of a measurement unit shown in FIG. 1.
Figure 4:
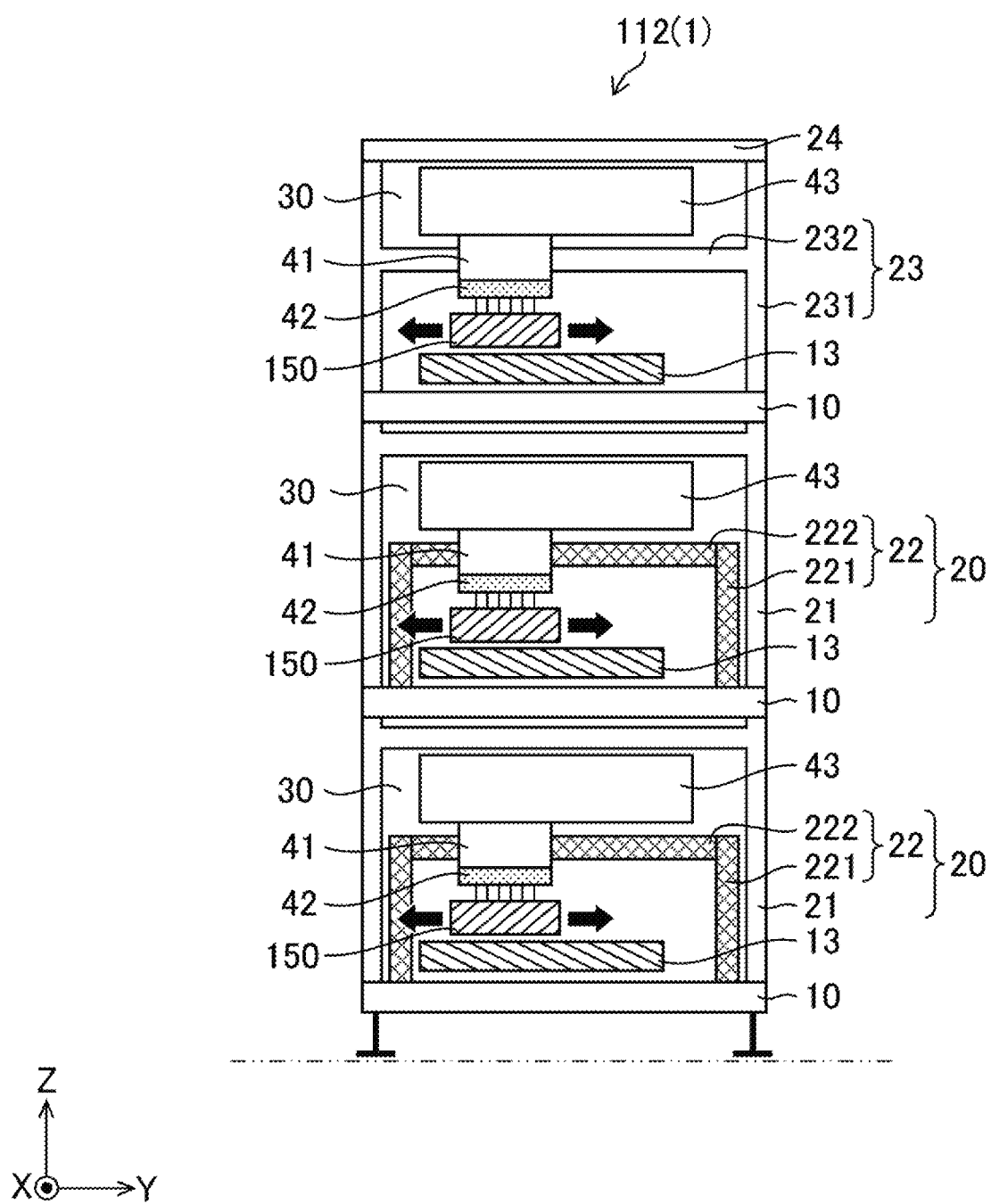
FIG. 4 is a diagram (side view) showing an internal structure of a measurement unit shown in FIG. 1.

FIGS. 3 and 4 are diagrams showing an internal structure of the measurement unit 112 shown in FIG. 1. FIG. 3 is a diagram of the measurement unit 112 as viewed from a front surface side (side of the loader unit 114) and FIG. 4 is a diagram of the measurement unit 112 as viewed from a side surface side.

As shown in FIGS. 3 and 4, the measurement unit 112 has a multi-layer structure (multi-stage structure) in which the measuring parts 30 are stacked in multiple stages, and the respective measuring parts 30 are two-dimensionally arrayed in the X direction and the Z direction. In the present embodiment, as an example, four measuring parts 30 arranged in the X direction, are stacked in three stages in the Z direction.

The measurement unit 112 is equipped with the housing 1 which partitions the measuring unit 112 to form the measuring parts 30. The housing 1 has a grid shape in which frames are combined in a grid pattern. A configuration of the housing 1 will be described in detail later.

Figure 5:
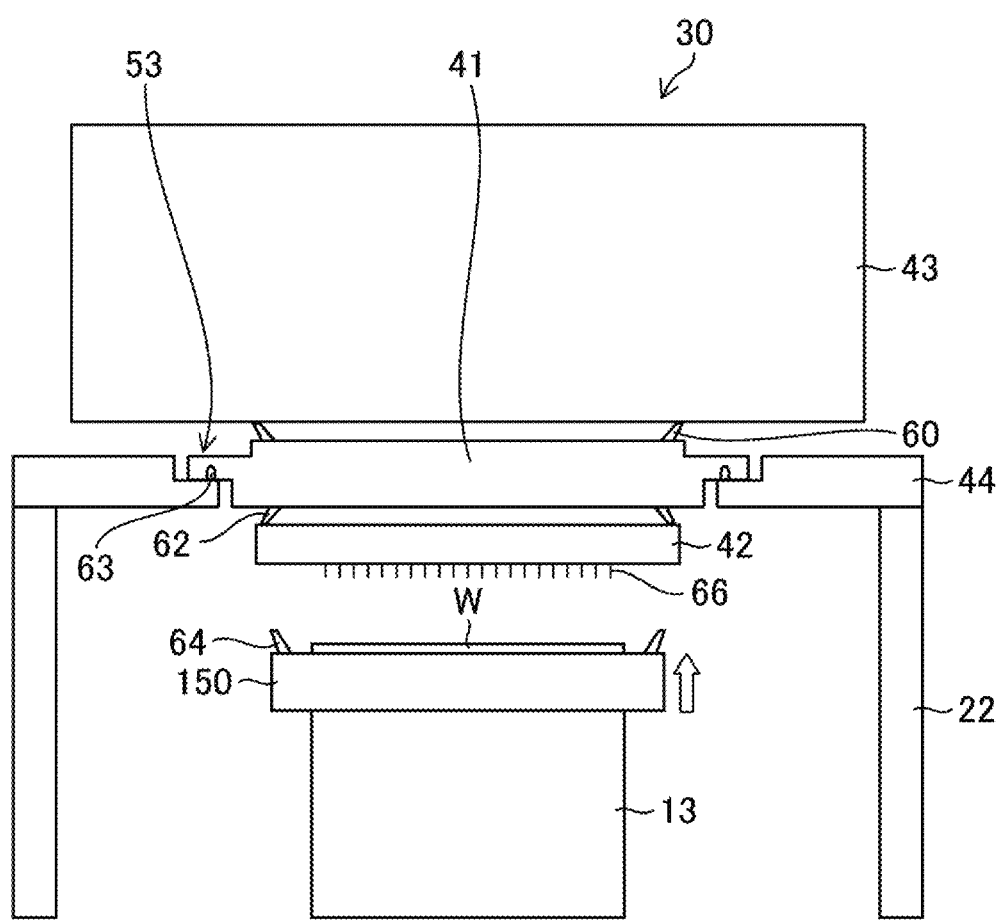
FIG. 5 is a schematic diagram showing a configuration of a measuring part.

The respective measuring parts 30 have the same configuration. As shown in FIG. 5, the measuring parts 30 includes a head plate 44, a test head 43, a probe card 42, and a pogo frame 41 interposed between the test head 43 and the probe card 42.

The test head 43 is supported above the head plate 44 by a test head holding part (not illustrated). The test head 43 is electrically connected to probes 66 of the probe card 42. The test head 43 supplies each chip with power and a test signal for an electrical inspection, and detects an output signal from each chip to measure whether or not each chip operates properly.

The head plate 44 is supported by the housing 1, and includes a pogo frame mounting part 53. The pogo frame mounting part 53 has a circular opening that corresponds to a planar shape of the pogo frame 41. The pogo frame mounting part 53 has a positioning pin 63 and the pogo frame 41 is fixed to the pogo frame mounting part 53 in a state of being positioned by the positioning pin 63. A fixing method of the pogo frame 41 is not particularly limited. For example, as a method of fixing the pogo frame 41, a method of causing the pogo frame 41 to sucked by vacuum suction on a support surface (suction surface) of the pogo frame mounting part 53 using suction means (not illustrated), may be preferably used. As fixing means other than vacuum suction, mechanical fixing means such as screws may be used.

The pogo frame 41 has a large number of pogo pins (not illustrated) which electrically connect each terminal formed on a lower surface (a surface opposing the pogo frame 41) of the test head 43 to each terminal formed on an upper surface (a surface opposing the pogo frame 41) of the probe card 42. In addition, sealing members 60 and 62 respectively having ring shapes are formed in outer circumferential parts of an upper surface (a surface opposing the test head 43) and a lower surface (a surface opposing the probe card 42) of the pogo frame 41. Furthermore, the test head 43, the pogo frame 41, and the probe card 42 are integrated in a case where a space enclosed by the test head 43, the pogo frame 41 and the sealing member 60, and a space enclosed by the probe card 42, the pogo frame 41 and the sealing member 62 are depressurized by suction means (not illustrated).

The probe card 42 includes a large number of probes 66 corresponding to electrodes of the respective chips of the wafer W. Each probe 66 is formed so as to protrude downward from a lower surface (a surface opposing a wafer chuck 150) of the probe card 42 and is electrically connected to each terminal provided on the upper surface (the surface opposing the pogo frame 41) of the probe card 42. Therefore, when the test head 43, the pogo frame 41, and the probe card 42 are integrated, each probe 66 is electrically connected to each terminal of the test head 43 via the pogo frame 41. Note that the probe card 42 in the present example is equipped with the large number of probes 66 corresponding to electrodes of all of the chips of the wafer W to be inspected, and simultaneous inspections are performed for the chips on the wafer W held by the wafer chuck 150, in the respective measuring parts 30.

The wafer chuck 150 sucks and fixes the wafer W by vacuum suction or the like. The wafer chuck 150 is detachably supported by an alignment device 13 to be described later and is configured to be movable in the X, Y, Z, and θ directions by the alignment device 13. In addition, a ring-shaped sealing member 64 is provided in an outer circumferential part of an upper surface (wafer placement surface) of the wafer chuck 150. A space enclosed by the probe card 42, the wafer chuck 150 and the sealing member 64 is depressurized by suction means (not illustrated) so that the wafer chuck 150 is drawn towards the probe card 42. Accordingly, each probe 66 of the probe card 42 comes into contact with an electrode pad of each chip of the wafer W so that an inspection may be started.

A heating/cooling mechanism (not illustrated) as a heating/cooling source is provided inside the wafer chuck 150 so that electrical characteristics of the chips may be inspected in a high-temperature state (for example, 150° C. at maximum) or in a low-temperature state (for example, −40° C. at minimum). An appropriate known heater/cooler may be adopted as the heating/cooling mechanism, and various heating/cooling mechanisms are conceivable. For example, the heating/cooling mechanism may be a mechanism having a double layer structure of: a heating layer with planer heater; and a cooling layer with a pathway for a cooling fluid. For further example, the heating/cooling mechanism may be a heating/cooling device with a single layer structure of a thermal conductor embedded with a cooling tube around which a heating heater is wound. In addition, instead of electrical heating, a thermal fluid may be circulated or a Peltier element may be used.

The measurement unit 112 is further equipped with the alignment device 13 which detachably supports the wafer chuck 150. The alignment device 13 is provided on each stage and is configured to be mutually movable among measuring parts 30 arranged on the each layer (each stage) by an alignment device drive mechanism (not illustrated). In other words, the alignment device 13 is shared by measuring parts 30 (in the present example, four measuring parts 30) which are arranged on the same layer (stage) as the alignment device 13, and moves among the measuring parts 30 arranged on the same layer. Note that the alignment device 13 is an example of the "moving stage" according to the present invention. In addition, once the alignment device 13 moves to each measuring part 30, the alignment device 13 is fixed by a positioning/fixing device (not illustrated), and then the wafer chuck 150 is moved in the X, Y, Z, and θ directions by the alignment device drive mechanism described above so as to perform relative positioning between the wafer W being held by the wafer chuck 150 and the probe card 42. Although not illustrated, the alignment device 13 is equipped with a probe tip position detection camera and a wafer alignment camera in order to detect a relative positional relationship between electrodes of chips of the wafer W held by the wafer chuck 150 and the probes 66.

While the alignment device 13 sucks and fixes the wafer chuck 150 by vacuum suction or the like, fixing means other than vacuum suction may be adopted as long as the wafer chuck 150 may be fixed. For example, the wafer chuck 150 may be fixed by mechanical means or the like. In addition, the alignment device 13 is provided with positioning means (not illustrated) so that the definite relative positional relationship with the wafer chuck 150 may be maintained.

Next, an inspection method using the prober 100 according to the present embodiment will be described.

When an inspection is performed using the prober 100 according to the present embodiment, in the loader unit 114, the wafer W inside the wafer cassette 120 is extracted by the conveyance arm 124 of the conveyance unit 122 and conveyed to each measuring part 30 of the measurement unit 112 in a state of being held by the upper surface of the conveyance arm 124.

On the other hand, in the measurement unit 112, the alignment device 13 provided for each layer (each stage) moves to a predetermined measuring part 30 and the wafer chuck 150 is positioned on an upper surface of the alignment device 13 and fixed by suction.

Subsequently, the alignment device 13 moves the wafer chuck 150 to a predetermined delivery position. In addition, once the wafer W is delivered by the conveyance unit 122 of the loader unit 114, the wafer W is held on the upper surface of the wafer chuck 150.

Next, the alignment device 13 moves the wafer chuck 150 holding the wafer W thereon, to a predetermined alignment position, and detects relative positional relationship between the electrodes of the chips of the wafer W held by the wafer chuck 150 and the probes 66 using the probe tip position detection camera and the wafer alignment camera (both not illustrated). Then, the alignment device 13 moves the wafer chuck 150 in the X, Y, Z, and θ directions based on the detected positional relationship to perform relative positioning between the wafer W held by the wafer chuck 150 and the probe card 42.

After the positioning is performed, the alignment device 13 moves the wafer chuck 150 to a predetermined measurement position (a position opposing the probe card 42) and moves the wafer chuck 150 upward until a height of the wafer chuck 150 equals a predetermined height (specifically, a height at which the sealing member 64 formed on the upper surface of the wafer chuck 150 comes into contact with the lower surface (the surface opposing the wafer chuck 150) of the probe card 42). At this point, preferably, suction by suction means (not illustrated) is started before the sealing member 64 comes into contact with the lower surface of the probe card 42 (in other words, before the space enclosed by the probe card 42, the wafer chuck 150, and the sealing member 64 becomes a sealed space). Accordingly, since suction is being performed by the suction means, an effect of a reactive force (counterforce) due to compression of the space can be prevented even if the wafer chuck 150 is moved upward. Note that the suction by the suction means may be started at the same timing when the sealing member 64 comes into contact with the lower surface of the probe card 42.

Subsequently, the alignment device 13 releases the fixing of the wafer chuck 150. Accordingly, the wafer chuck 150 detaches from the alignment device 13. In addition, because the space enclosed by the probe card 42, the wafer chuck 150 and the scaling member 64 is depressurized due to suction by the suction means, the wafer chuck 150 is drawn towards the probe card 42 so as to be brought into close contact with the probe card 42. and the wafer chuck 150 As a result, the respective probes 66 of the probe card 42 come into contact with the electrode pads of the respective chips on the wafer W with uniform contact pressure.

Figure 6:
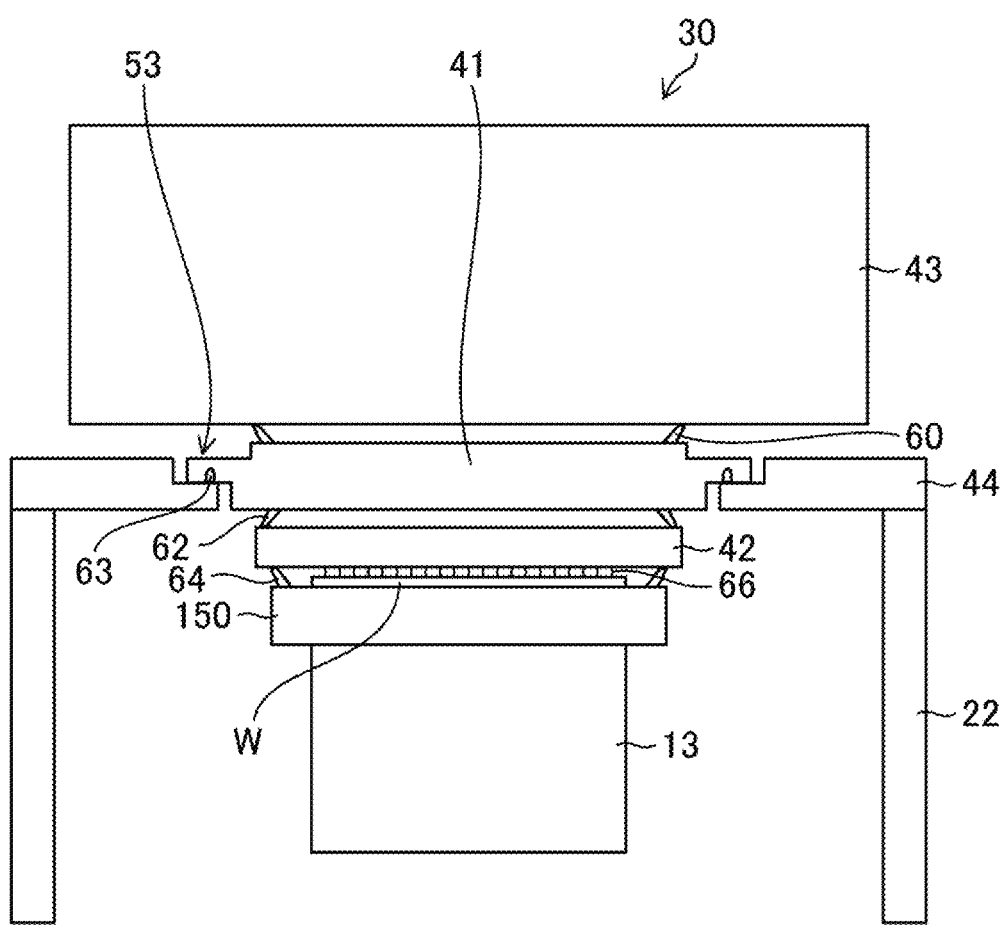
FIG. 6 is a diagram showing a state where a test head, a pogo frame, a probe card, and a wafer chuck are integrated.

Thus, as shown in FIG. 6, the measuring part 30 assumes a state where the test head 43, the pogo frame 41, the probe card 42, and the wafer chuck 150 are integrated so that a wafer-level inspection may be started.

Subsequently, power and a test signal are supplied to each chip on the water W from the test head 43, and the inspection of an electrical operation is performed by detecting a signal outputted from each chip.

Thereafter, with respect to other measuring parts 30, the wafer W is supplied onto the wafer chuck 150, and after an alignment operation and a contact operation are completed simultaneous inspections of the respective chips on the wafer W are sequentially performed in each measuring part 30, according to a similar procedure. In other words, in each measuring part 30, power and a test signal are supplied to each chip on the water W from the test head 43 and an inspection of an electrical operation is performed by detecting a signal outputted from each chip.

Once the inspection is completed in the respective measuring parts 30, the alignment device 13 is sequentially moved to the respective measuring parts 30 and the wafer chuck 150 holding the inspected wafer W is collected.

Specifically, when the alignment device 13 moves to the measuring part 30 where the inspection has been finished, the alignment device 13 is moved upward to a position where the upper surface of the alignment device 13 abuts with the wafer chuck 150 and the depressurization of the space enclosed by the probe card 42, the wafer chuck 150 and the scaling member 64 is released. In addition, the alignment device 13 positions and fixes the wafer chuck 150 to the upper surface of the alignment device 13. Furthermore, the alignment device 13 moves the wafer chuck 150 to a predetermined delivery position, unfixes the inspected wafer W from the wafer chuck 150, and delivers the inspected wafer W to the conveyance unit 122. The inspected wafer W delivered to the conveyance unit 122 is held by the conveyance arm 124 and returned to the wafer cassette 120 arranged in the loader unit 114.

While one wafer chuck 150 is respectively assigned to each measuring part 30 in the present embodiment as shown in FIGS. 3 and 4, the wafer chuck 150 may be shared among measuring parts 30. In this case, the alignment device 13 moves the wafer chuck 150 among the measuring parts 30 which share the wafer chuck 150.

[Housing]

Next, a configuration of the housing 1 applied to the prober 100 according to the present embodiment will be described in detail. The housing 1 is an example of the "housing for a prober" according to the present invention.

As shown in FIGS. 3 and 4, in the housing 1 according to the present embodiment, frames are combined to have a grid pattern so as to form compartments corresponding to the measuring parts 30 on each layer. In the housing 1, in order to effectively suppress vibration generated in the prober 100 (such as vibration created by a movement of the alignment device 13 and vibration constantly generated in each measuring part 30), a frame (the side frame body 20) arranged on each layer (in the present embodiment, with the exception of the uppermost layer) has a divided frame structure. While details will be provided later, the side frame body 20 arranged on one layer is configured so as to include: a first side frame 21 which supports another layer arranged above the one layer; and a second side frame 22 which supports a measuring part constituent member (which includes the head plate 44, the pogo frame 41, the probe card 42, and the test head 43) arranged in the measuring parts 30 in the one layer. In the following description, the respective layers in FIGS. 3 and 4 will be referred to as a first layer, a second layer, and a third layer, from bottom to top. In the example shown in FIGS. 3 and 4, the first layer is a lowermost layer and the third layer is an uppermost layer.

First, in the housing 1 according to the present embodiment, a configuration of the uppermost layer differs from a configuration of layers other than the uppermost layer due to reasons to be described later. Firstly, the configuration of layers other than the uppermost layer or, in other words, a configuration of the first and second layers in FIGS. 3 and 4 will be described.

Each layer other than the uppermost layer includes: a floor base 10 which constitutes a floor surface of each layer of the multi-layer structure; and side frame bodies 20 which are provided between the floor bases 10 of the respective layers. The floor base 10 has a flat plate shape which is elongated in the X direction (that is, a longitudinal direction of the floor base 10 is the X direction) and which is parallel to the XY plane. Preferably, the floor base 10 is formed so as to be shared among the measuring parts 30 (compartments) provided on one layer.

In addition, preferably, on layers other than the uppermost layer, a ceiling of the floor base 10 of a given layer doubles (serves) as a floor base 10 of another layer immediately below the given layer. For example, in FIGS. 3 and 4, the floor base 10 of the third layer doubles as a ceiling of the floor base 10 of the second layer.

Preferably, an upper surface of the floor base 10 of each layer is provided with a guide rail (or guide rails) (not illustrated) which guides a movement of the alignment device 13 in the X direction.

The side frame bodies 20 are arranged between the floor base 10 of a given layer and the floor base 10 of another layer positioned above the given layer, and arranged in both end parts in the Y direction (both side parts in the Y direction) of the floor base 10.

There are two types of the side frame bodies 20: a first side frame 21 and a second side frame 22 which is provided separately from the first side frame 21.

For example, the first side frame 21 has a columnar shape that extends in the Z direction. In addition, one end of the first side frame 21 is arranged at, for example, an end in the Y direction of an upper surface of the floor base 10 of a given layer and another end of the first side frame 21 is arranged at, for example, an end in the Y direction of a lower surface of the floor base 10 of another layer positioned above the given layer.

In other words, the first side frame 21 is erected on a side of the upper surface (a surface on which the guide rail is formed) of the floor base 10 of a given layer and supports a side of the lower surface (a surface on an opposite side to the surface on which the guide rail is formed) of the floor base 10 of another layer positioned above the given layer.

According to FIG. 4, for example, the first side frame 21 of the second layer supports the floor base 10 of the third layer (uppermost layer). By coupling the floor bases 10 in the Z direction by the first side frames 21, a multi-layer structure in which multiple stages are stacked in the Z direction is formed.

The second side frame 22 is erected on the upper surface of the floor base 10 of each layer at a position which differs from that of the first side frame 21. For example, as shown in FIG. 4, the second side frame 22 is juxtaposed (parallelly arranged) to the first side frame 21 at a position adjacent to the first side frame 21. In addition, the second side frames 22 are preferably arranged at constant intervals in the X direction. Specifically, the second side frames 22 are respectively arranged between the measuring parts 30, and on outer sides of the measuring parts 30 at both ends in the X direction.

For example, each second side frame 22 has an approximately gate-like shape. Each second side frame 22 includes: two column parts 221 which extend in the Z direction; and a beam part 222 which spans between the two column parts 221 and extends in the Y direction. Note that the shape of the beam part 222 is not necessarily a straight rod shape. The shape of the beam part 222 may be appropriately changed or modified according to a shape and desirable arrangement of the measuring part constituent member (to be described later). For example, the two column parts 221 of the second side frames 22 are arranged in the vicinity of both ends in the Y direction of the respective measuring parts 30.

The measuring part constituent member arranged in each measuring part 30 on each layer other than the uppermost layer includes the head plate 44, the pogo frame 41, the probe card 42, and the test head 43. The head plate 44 is a flat plate-shaped member arranged in the measuring part 30 and, as described above, includes the pogo frame mounting part 53 (refer to FIG. 5). The pogo frame 41 is fixed to the pogo frame mounting part 53 of the head plate 44. In addition, the pogo frame 41 is configured such that the test head 43 and the probe card 42 are respectively integrated on upper surface and lower surface of the pogo frame 41 by suction means (not illustrated). In other words, the head plate 44 is a member which directly or indirectly supports the pogo frame 41, the probe card 42, and the test head 43 which constitute the measuring part constituent member.

The head plate 44 configured in this manner is supported by the second side frame 22 (more specifically, the beam part 222). Preferably, a position (support position) where the head plate 44 is supported by the second side frame 22 is the lower surface of the head plate 44. However, the support position is not necessarily limited thereto, and may be another position (for example, a side surface of the head plate 44). Accordingly, the measuring part constituent member arranged in each measuring part 30 of each layer other than the uppermost layer is respectively directly or indirectly supported by the second side frame 22 and the inspection described above is to be performed in each measuring part 30.

As described above, on each of the layers other than the uppermost layer, the first side frame 21 which supports the floor base 10 of an upper layer is separately provided from the second side frame 22 which supports the measuring part constituent member arranged on the own layer.

Next, a configuration of the uppermost layer will be described. The uppermost layer includes the floor base 10, uppermost layer side frame bodies 23, and a frame part 24. In the uppermost layer (the third layer in FIGS. 3 and 4), while the uppermost layer side frame bodies 23 may have a same configuration as the side frame bodies 20 of the other layers as in a modification (refer to FIG. 11) to be described later, since there is no need to support the floor base 10 of an upper layer, the side frame body 20 need not be configured to have two mutually different types of frames (the first side frame 21 and the second side frames 22) as in each of the layers other than the uppermost layer. In addition, when the uppermost layer has a simpler configuration to reduce its weight, the overall configuration of the housing 1 may be made more stable.

Due to these reasons, in the uppermost layer, the uppermost layer side frame bodies 23 have a simpler configuration than the side frame bodies 20 of the other layers. More specifically, the uppermost layer side frame bodies 23 have both functions of supporting a ceiling (not illustrated) and supporting the measuring part constituent member. In other words, the uppermost layer side frame bodies 23 function as the first side frame 21 and the second side frame 22 in the side frame bodies 20 of the other layers.

As shown in FIGS. 3 and 4, the uppermost layer side frame bodies 23 are arranged at positions that almost correspond to the second side frames 22 and have approximately the same shape as the second side frames 22. In other words, the uppermost layer side frame bodies 23 are erected on the upper surface of the floor base 10 of the uppermost layer in a similar manner to the second side frames 22. Furthermore, the uppermost layer side frame bodies 23 are arranged at constant intervals in the X direction. Specifically, the uppermost layer side frame bodies 23 are respectively arranged between the measuring parts 30, and on outer sides of the measuring parts 30 at both ends in the X direction.

The uppermost layer side frame bodies 23 have an approximately gate-like shape. The uppermost layer side frame bodies 23 includes: two column parts 231 which extend in the Z direction; and a beam part 232 which spans between the two column parts 231 and extends in the Y direction. Upper end sides of the column parts 231 exceed the beam part 232 and extend to the frame part 24 which constitutes a ceiling of the uppermost layer.

The shape of the beam part 232 may be appropriately changed or modified according to a shape and desirable arrangement of the measuring part constituent member. For example, the two column parts 231 of the uppermost layer side frame bodies 23 are arranged in the vicinity of both ends in the Y direction of the respective measuring parts 30.

The measuring part constituent member arranged in each measuring part 30 on the uppermost layer includes the head plate 44, the pogo frame 41, the probe card 42, and the test head 43 in a similar manner to the layers other than the uppermost layer. In addition, the head plate 44 of the uppermost layer is a member which directly or indirectly supports the pogo frame 41, the probe card 42, and the test head 43 which constitute the measuring part constituent member in a similar manner to the layers other than the uppermost layer.

The head plate 44 of the uppermost layer is supported by the uppermost layer side frame bodies 23 (more specifically, the beam part 232). While a support position of the head plate 44 by the uppermost layer side frame bodies 23 is preferably the lower surface of the head plate 44, the support position is not necessarily limited thereto and may be another position (for example, a side surface of the head plate 44). Accordingly, the measuring part constituent member arranged in each measuring part 30 of the uppermost layer is respectively directly or indirectly supported by the uppermost layer side frame bodies 23.

The frame part 24 connects the upper end parts of the uppermost layer side frame bodies 23 in the Z direction, and the ceiling (not illustrated) is fixed to the frame part 24.

Figure 7:
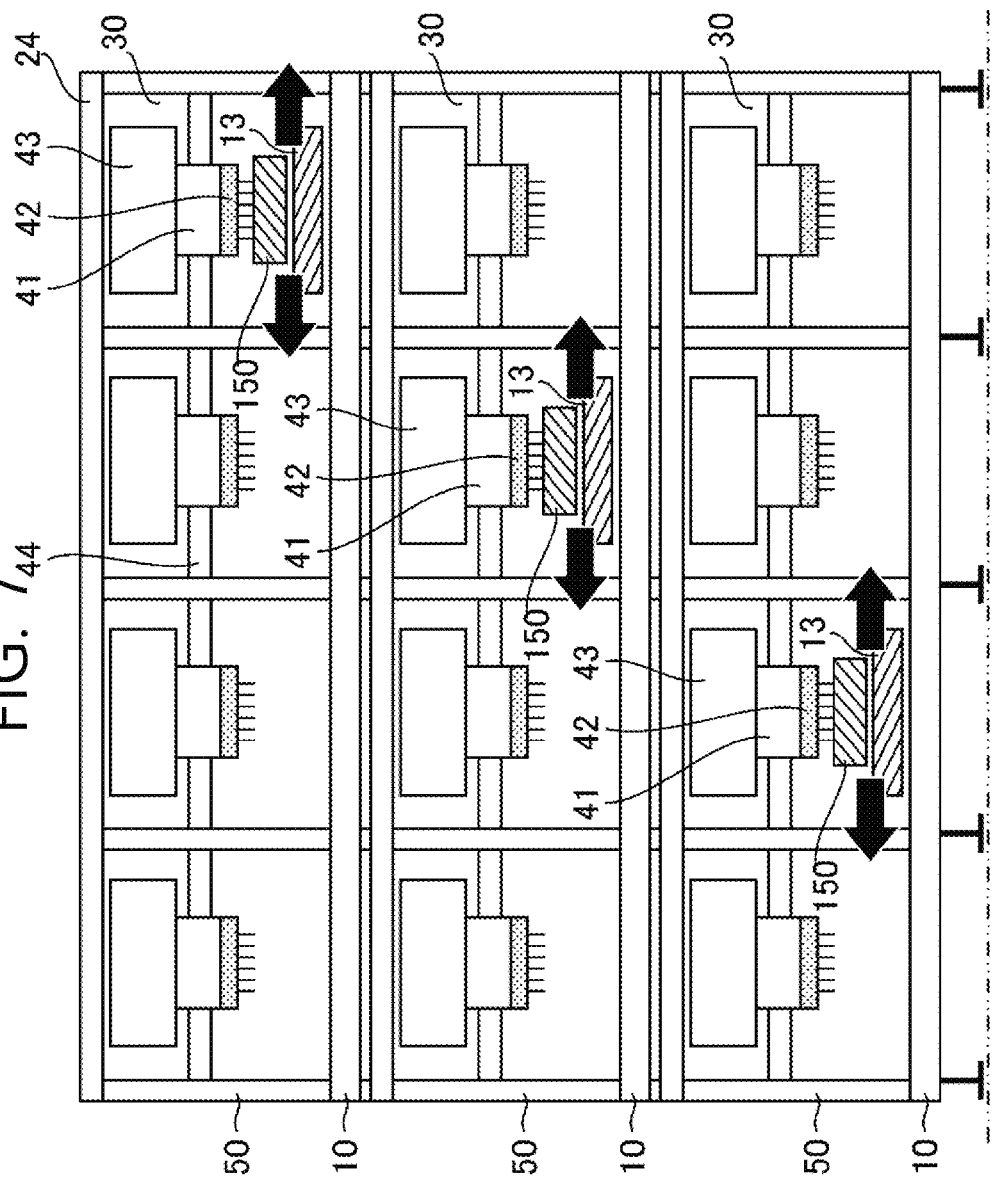
FIG. 7 is a diagram (front view) showing another configuration example (comparative example) of a housing.
Figure 8:
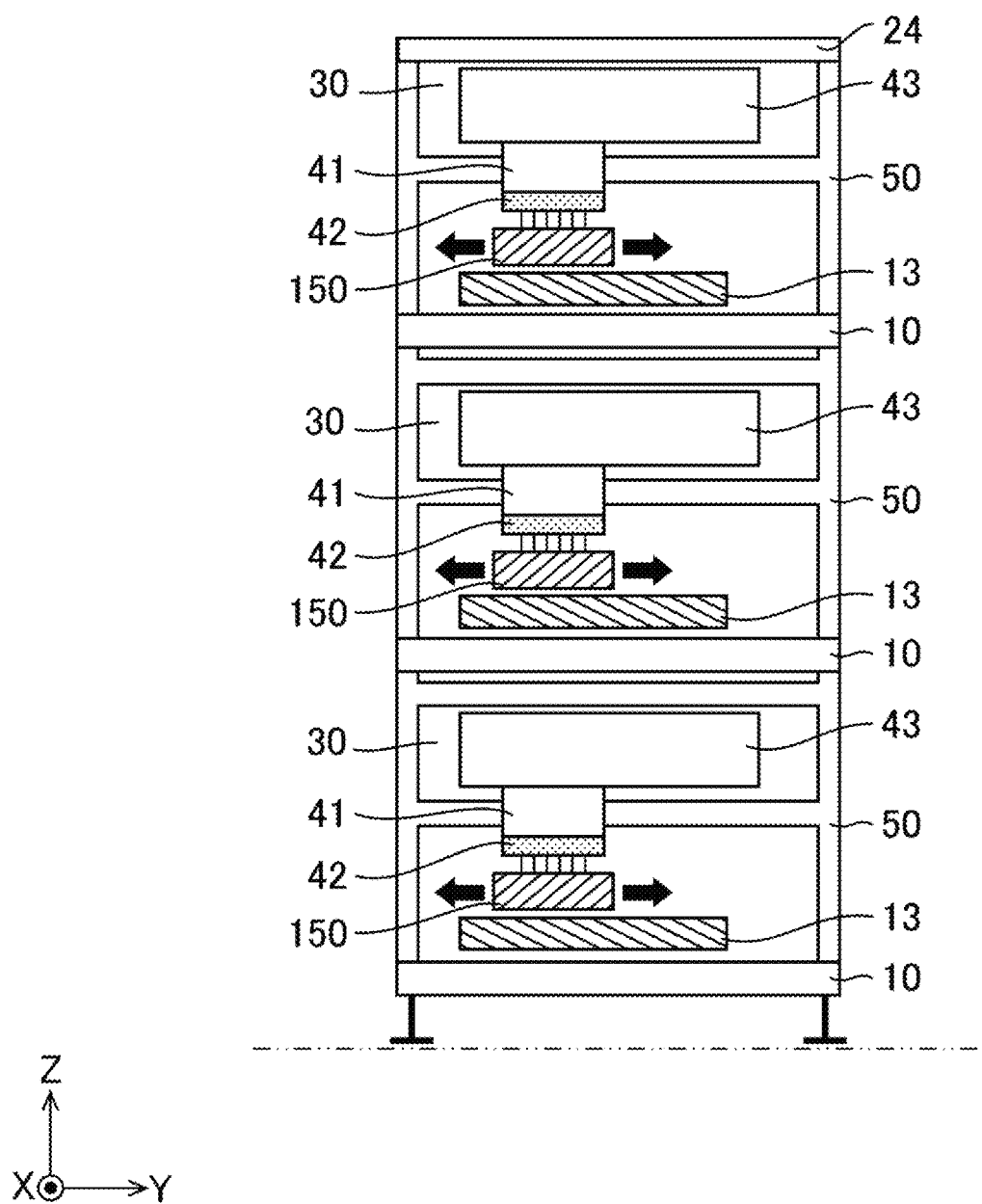
FIG. 8 is a diagram (side view) showing another configuration example (comparative example) of a housing.

FIGS. 7 and 8 are diagrams showing another configuration example (comparative example) of a housing applied to a prober. FIG. 7 is a front view of the housing according to the comparative example and FIG. 8 is a side view of the housing according to the comparative example. In the housing according to the comparative example shown in FIGS. 7 and 8, a side frame 50 of each layer has an integrated frame structure with both functions of supporting the floor base 10 of an upper layer and supporting the measuring part constituent member.

Therefore, in the housing according to the comparative example, when the alignment device 13 moves on a given layer and vibration is generated on the floor base 10, the vibration is transmitted through the side frame 50 and readily propagates to the floor base 10 of other layers positioned above and below the layer. As a result, there is a problem in that even if the movement of the alignment device 13 ends, a long settling time is required until the vibration caused by the movement of the alignment device 13 settles.

In addition, in the housing according to the comparative example, since the vibration of the floor base 10 of a given layer directly propagates to the side frame 50 of other layers positioned above and below the given layer, there is a problem in that the measuring part constituent member supported by the side frame 50 of other layers vibrates so as to deteriorate alignment accuracy and adversely affect results of wafer-level inspections.

On the other hand, the housing 1 according to the present embodiment adopts a divided frame structure in which the first side frame 21 which supports the floor base 10 of an upper layer and the second side frame 22 which supports the measuring part constituent member are separately constructed. Therefore, in a case where the alignment device 13 moves on a given layer and vibration is generated on the floor base 10, even if the vibration is transmitted through the first side frame 21 and propagates to the floor base 10 of other layers, the vibration is less likely to propagate to the measuring part constituent member supported by the second side frame 22 which is separated from the first side frame 21.

Accordingly, it is possible to suppress an adverse effect of vibration generated by the movement of the alignment device 13 on a given layer to a result of a wafer-level inspection and alignment accuracy on other layers positioned above and below the given layer.

In addition, with the housing 1 according to the present embodiment, since there is no need to restrict the movement of the alignment device 13 of other layers during an operation of the alignment device 13 of one layer among the alignment devices 13 arranged on the respective layers, an effect of vibration generated by the movement of the alignment devices 13 can be effectively suppressed without disadvantageously reducing throughput of the wafer-level inspection.

Furthermore, with the housing 1 according to the present embodiment, because the divided frame structure is adopted to the housing 1 as described above, even when vibration is generated due to a factor other than the movement of the alignment device 13 such as an abnormality of each component (for example, the test head 43) which constitutes the measuring parts 30, the vibration can be prevented from affecting the measuring parts 30 of other layers.

Figure 9:
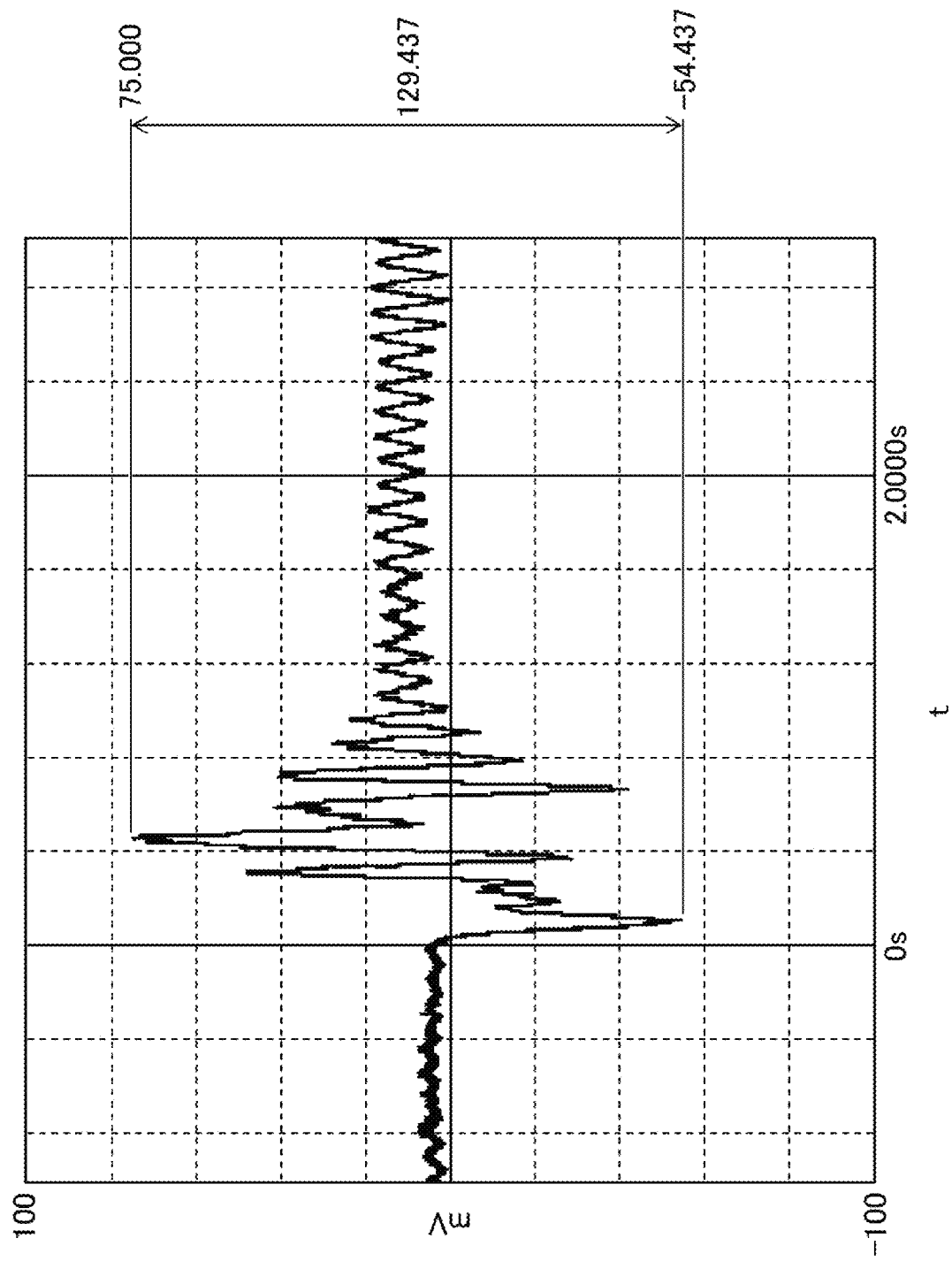
FIG. 9 is a diagram for explaining an effect of a housing according to the present embodiment.
Figure 10:
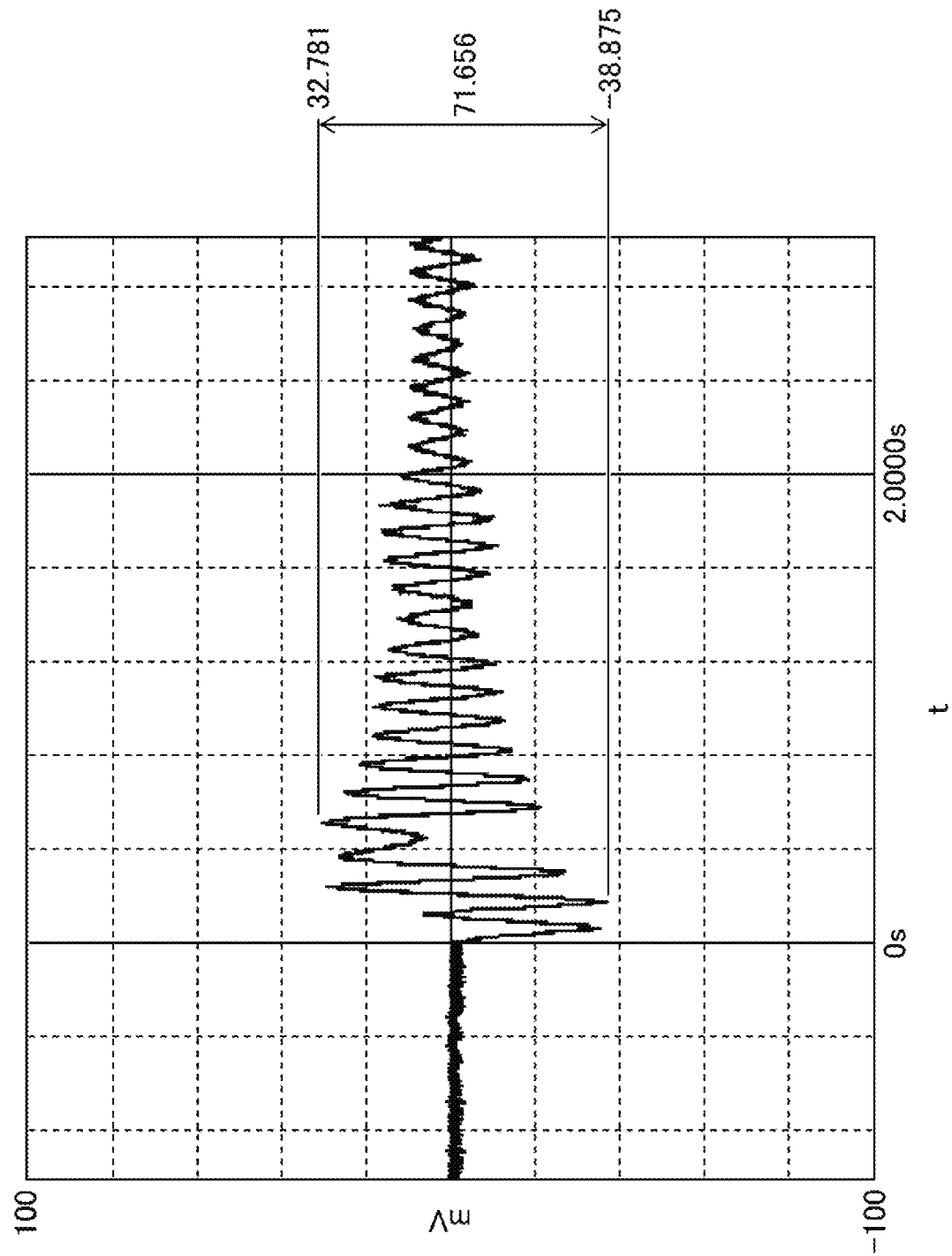
FIG. 10 is a diagram for explaining an effect of the housing according to the present embodiment.

Next, an advantageous effect realized by the housing 1 according to the present embodiment will be described more specifically with reference to FIGS. 9 and 10. FIG. 9 is a graph schematically showing how the side frame 50 of a layer positioned below a given layer vibrates, when vibration of a given constant amplitude is applied to the floor base 10 of the given layer for a certain period of time, in the housing according to the comparative example shown in FIGS. 7 and 8. FIG. 10 is a graph schematically showing how the second side frame 22 of a layer positioned below a given layer vibrates, when vibration of a given constant amplitude is applied to the floor base 10 for a certain period of time in the housing 1 according to the present embodiment, in a similar manner to the comparative example. The graphs in FIGS. 9 and 10 represent output waveforms of a vibration meter. In each graph, an axis of abscissa represents time in units of seconds and an axis of ordinate represents output voltage (corresponding to an amplitude of vibration) in units of mV.

In the graphs shown in FIGS. 9 and 10, a difference between a maximum value and a minimum value of output voltage corresponds to an amplitude of vibration generated on the measuring part constituent member of a layer positioned below the given layer due to propagation of vibration generated on the given layer.

In the graph shown in FIG. 9, the difference between the maximum value and the minimum value of output voltage of the vibration meter is approximately 129 mV which is a value corresponding to the amplitude of vibration in the second side frame 22 of a layer positioned below in the housing according to the comparative example. On the other hand, in the graph shown in FIG. 10, the difference between the maximum value and the minimum value of output voltage of the vibration meter is approximately 71.656 mV which is a value corresponding to the amplitude of vibration in the second side frame 22 of a layer positioned below in the housing 1 according to the present embodiment. A comparison between both amplitudes reveals that with the housing 1 according to the present embodiment, amplitude (in other words, a magnitude of vibration) can be reduced by over 40 percent, as compared to the housing according to the comparative example.

Modifications

Figure 11:
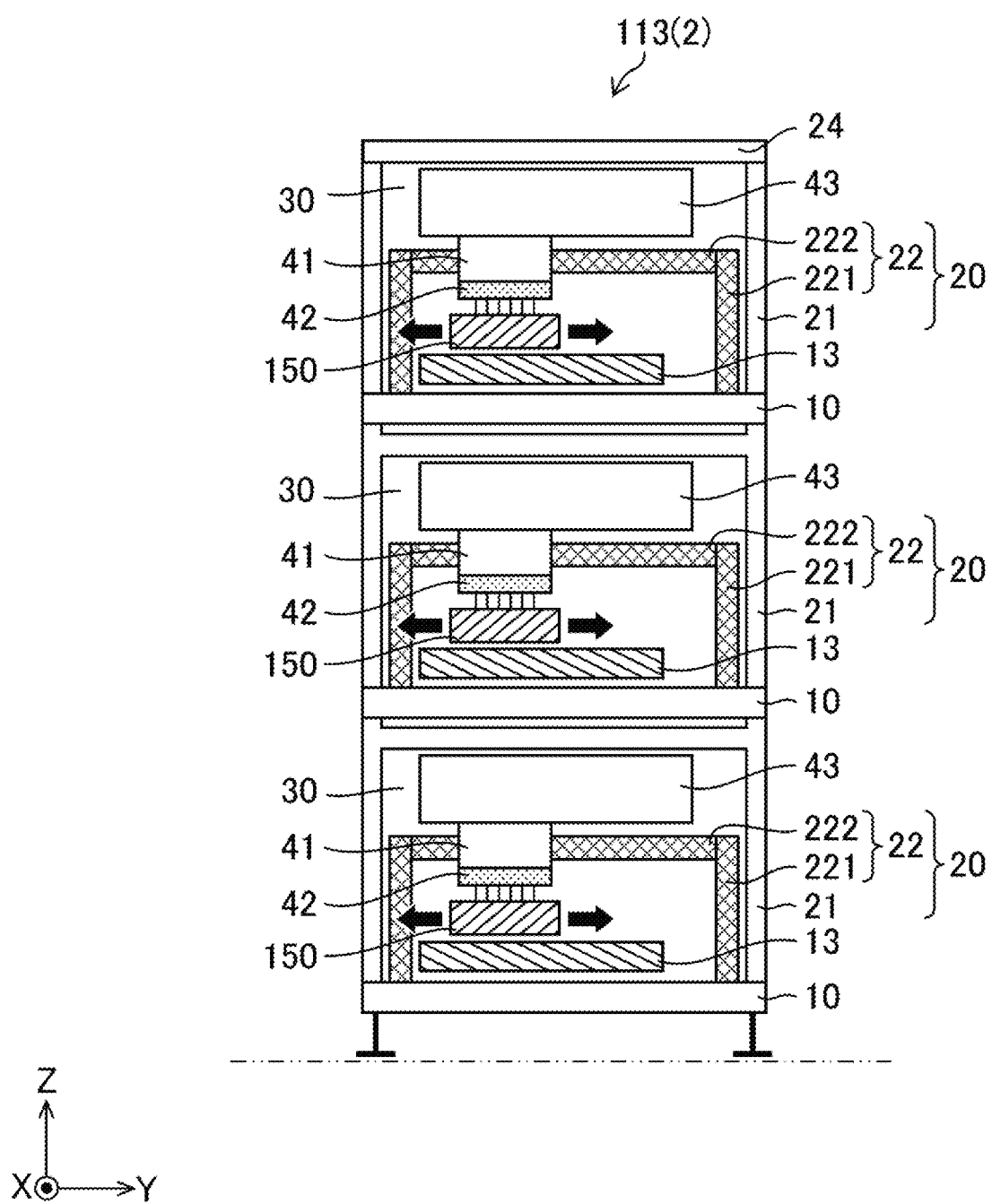
FIG. 11 is a diagram (side view) showing a modification example of the housing according to the present embodiment.

In the embodiment described above, explanation is made about a case where the configuration of the uppermost layer is simplified compared to layers other than the uppermost layer in order to make the uppermost layer lighter and stabilize the structure of the entire housing 1. However, the configuration of the uppermost layer may be the same as the configuration of other layers. FIG. 11 shows, as a modification example, a schematic configuration diagram (side view) of the measurement unit 112 whose housing 2 has the uppermost layer with the same configuration as other layers. Illustration of a front view of the housing 2 according to the modification example is omitted because it is the same as FIG. 3. Naturally, the housing 2 according to the modification example can also realize the advantageous effect described above.

In addition, in the embodiment described above, the number of layers and the number of the measuring parts 30 in the measurement unit 112 are not limited to the example shown in FIGS. 3 and 4.

Advantageous Effects

As described above, in the housing 1 according to the present embodiment, the side frame body 20 has a divided frame structure in which the first side frame 21 that supports the floor base 10 of an upper layer and the second side frame 22 that supports the measuring part constituent member, are constructed separately from each other. Accordingly, even when the alignment device 13 moves on a given layer to generate vibration on the floor base 10 and the vibration propagates to the floor base 10 of upper and lower layers through the first side frame 21, the vibration is less likely to propagate to the measuring part constituent member supported by the second side frame 22 which is separate from the first side frame 21 on the upper and lower layers.

Thus, vibration generated by the movement of the alignment device 13 on a given layer, is suppressed from adversely affecting alignment accuracy and a result of a wafer-layer inspection on other layers positioned above and below the given layer.

With the housing 1 according to the present embodiment, since the movement of the alignment device 13 is not restricted, throughput of a wafer-level inspection by a prober may be favorably maintained while suppressing adverse effect of vibration on alignment accuracy and a result of the wafer-level inspection.

With the housing 1 according to the present embodiment, since the divided frame structure reduces effects caused by vibration, even when vibration is generated due to a factor other than the movement of the alignment device 13 such as an abnormality of the measuring parts 30, the advantageous effect described above may be realized.

While the embodiment of the present invention has been described, the present invention is not limited to the examples described above. It is obvious that various improvements and modifications may be made without departing from the scope of the invention.

REFERENCE SIGNS LIST 1,2 housing
10 floor base
13 alignment device
20 side frame body
21 first side frame
22 second side frame
23 uppermost layer side frame body
24 frame part
30 measuring part
41 pogo frame
42 probe card
43 test head
44 head plate
50 side frame
53 pogo frame mounting part
60, 62, 64 sealing member
63 positioning pin
66 probe
22 column part
222 beam part
231 column part
232 beam part
100 prober
112 measurement unit
114 loader unit
118 load port
120 wafer cassette
121 operating panel
122 conveyance unit
124 conveyance arm
150 wafer chuck
W wafer

What is claimed is:

1. A housing for a prober having a multi-layer structure in which a plurality of measuring parts are stacked in multiple stages and a moving stage is configured to be movable among two or more measuring parts arranged on a same layer, the housing for a prober comprising:

floor bases configured to constitute floor surfaces of respective layers of the multi-layer structure; and a side frame body which is arranged between a floor base of one layer and a floor base of another layer positioned above the one layer among the plurality of layers, and positioned in both side parts of the measuring parts, wherein the side frame body includes:

a first side frame which is erected on the floor base of the one layer and supports a lower surface side of the floor base of the another layer; and a second side frame which is erected on the floor base of the one layer at a position different from that of the first side frame, and supports a measuring part constituent member arranged in each measuring part, and the second side frame has a gate form comprising two column parts and a beam part which spans between the two column parts, in such a manner that the moving stage is movable among two or more measuring parts on the one layer.

2. The housing for a prober according to claim 1, wherein the side frame body is arranged on a layer other than an uppermost layer among the plurality of layers.

3. The housing for a prober according to claim 2, further comprising a head plate having a holding unit configured to hold the measuring part constituent member, wherein a lower surface side of the head plate is supported by the second side frame.

4. The housing for a prober according to claim 1, wherein the second side frame is juxtaposed to the first side frame at a position adjacent to the first side frame.

5. The housing for a prober according to claim 1, wherein the measuring part constituent member is one of a pogo frame, a probe card and a test head.

6. A prober comprising the housing for a prober according to claim 1, wherein at least two or more measuring parts are provided on the one layer, and the prober comprises a moving stage capable of moving a wafer to be inspected to each of the measuring parts arranged on the one layer.

7. The housing for a prober according to claim 1, wherein the floor base of the one layer has a flat plate shape which is elongated in a first direction and parallel to a horizontal plane, the moving stage is movable in the first direction on the one layer, and in the second side frame, the beam part extends in a second direction different from the first direction on the horizontal plane.

* * * * *